United States Patent
Agata et al.

(10) Patent No.: US 6,862,205 B2
(45) Date of Patent: Mar. 1, 2005

(54) SEMICONDUCTOR MEMORY DEVICE

(75) Inventors: Masashi Agata, Osaka (JP); Kazunari Takahashi, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 59 days.

(21) Appl. No.: 10/372,971

(22) Filed: Feb. 26, 2003

(65) Prior Publication Data

US 2003/0169617 A1 Sep. 11, 2003

(30) Foreign Application Priority Data

Mar. 6, 2002 (JP) .......................... 2002-059784

(51) Int. Cl.⁷ .......................... G11C 11/24; G11C 7/00; G11C 11/34; G11C 7/02; G11C 8/00
(52) U.S. Cl. .................. 365/149; 365/222; 365/187; 365/202; 365/207; 365/233
(58) Field of Search ................. 365/149, 222, 365/187, 202, 207, 233

(56) References Cited

U.S. PATENT DOCUMENTS

| | | | |
|---|---|---|---|
| 4,203,159 A | | 5/1980 | Wanlass ...................... 365/222 |
| 4,264,872 A | * | 4/1981 | Suzuki ........................ 330/253 |
| 4,578,781 A | * | 3/1986 | Ogawa et al. ............... 365/203 |
| 4,645,564 A | * | 2/1987 | Morie et al. |
| 5,007,022 A | | 4/1991 | Leigh |
| 5,250,828 A | | 10/1993 | Honma ........................ 257/296 |
| 5,295,110 A | * | 3/1994 | Sakakibara .................. 365/222 |
| 5,600,598 A | | 2/1997 | Skjaveland et al. |
| 5,636,171 A | * | 6/1997 | Yoo et al. .................... 365/222 |
| 6,026,043 A | * | 2/2000 | Suzuki ........................ 365/222 |
| 6,256,220 B1 | * | 7/2001 | Kamp ......................... 365/145 |
| 6,256,221 B1 | * | 7/2001 | Holland et al. ............. 365/149 |
| 6,549,451 B2 | * | 4/2003 | Jain ............................ 365/154 |
| 6,727,129 B1 | * | 4/2004 | Nakajima ................... 438/197 |
| 2001/0033508 A1 | * | 10/2001 | Waller ........................ 365/49 |
| 2001/0053106 A1 | * | 12/2001 | Sadakata ............... 365/230.05 |
| 2002/0012272 A1 | * | 1/2002 | Shukuri et al. |
| 2002/0036308 A1 | | 3/2002 | Endoh et al. ............... 257/298 |
| 2002/0039316 A1 | * | 4/2002 | Tobita |
| 2002/0054522 A1 | | 5/2002 | Inoue et al. ................ 365/200 |
| 2002/0097595 A1 | * | 7/2002 | Chien ......................... 365/49 |
| 2002/0161977 A1 | * | 10/2002 | Chien ......................... 711/149 |
| 2003/0003770 A1 | * | 1/2003 | Morita et al. |
| 2003/0067829 A1 | * | 4/2003 | Keeth et al. ................ 365/222 |
| 2003/0111681 A1 | * | 6/2003 | Kawanaka |
| 2004/0027860 A1 | * | 2/2004 | Shukuri et al. |

FOREIGN PATENT DOCUMENTS

| | | | | |
|---|---|---|---|---|
| JP | 55-153194 | | 11/1980 | |
| JP | 04259981 A | * | 9/1992 | ......... G11C/11/401 |
| JP | 04306875 A | * | 10/1992 | ......... H01L/27/108 |

* cited by examiner

*Primary Examiner*—David Nelms
*Assistant Examiner*—Ly Duy Pham
(74) *Attorney, Agent, or Firm*—McDermott Will & Emery LLP

(57) ABSTRACT

The semiconductor memory device includes: a memory cell including a capacitor having a charge storage node and a first MIS transistor and a second MIS transistor each having a source connected to the charge storage node; a first word line and a first bit line respectively connected to the gate and the drain of the first MIS transistor; a second word line and a second bit line respectively connected to the gate and the drain of the second MIS transistor; and a timer circuit for generating a periodic signal having a predetermined period. The first word line or the second word line is activated in response to the periodic signal.

15 Claims, 9 Drawing Sheets

SEMICONDUCTOR MEMORY DEVICE

BACKGROUND OF THE INVENTION

The present invention relates to a semiconductor memory device that stores desired data and also permits data write and read operation at high speed.

A dynamic random access memory (DRAM) device, for example, among various types of semiconductor memory devices, has been frequently used as a semiconductor memory device capable of recording and holding a large capacity of data.

In recent years, with the tendency of a finer design rule in the semiconductor process, the DRAM cell structure generally composed of one transistor and one capacitor has been complicated, and thus the process cost has become increasingly high. For this reason, in a so-called system LSI in which both a DRAM circuit and an arithmetic-logic circuit are fabricated, there is often used a DRAM cell having a simple planer structure in which a MOS transistor is used in place of the capacitor for reduction of the process cost.

FIG. 9 shows an exemplary configuration of a DRAM cell disclosed in U.S. Pat. No. 5,600,598, in which a MOS transistor is used as a capacitor.

As shown in FIG. 9, the conventional DRAM cell includes an access transistor 101 that is a first MOS transistor having its gate and drain connected to a word line WL and a bit line BL, respectively, and a charge storage transistor 102 that is a second MOS transistor for storing charge in its channel. The source and drain of the charge storage transistor 102 are connected to the source of the access transistor 101, and the gate thereof is connected to a cell plate.

In the DRAM cell having the configuration described above, during write operation, for example, the word line WL is activated, and when the voltage value of the bit line BL is in a high level at this time, "1" is written in the channel of the charge storage transistor 102. Contrarily, when the voltage value of the bit line BL is in a low level, "0" is written in the channel.

During read operation, by activation of the word line WL, charge stored in the channel of the charge storage transistor 102 is transferred to the precharged bit line BL, and the potential of the bit line BL is amplified with a sense amplifier connected to the bit line BL, so that data in the selected DRAM cell is read.

In recent years, further enhancement in performance has been demanded for LSI systems, and in this relation, it is requested to enhance the performance of semiconductor memory devices (memory blocks). DRAM cells are advantageously used when a large-capacity memory device is required because each DRAM cell is composed of a smaller number of elements compared with a SRAM cell. In DRAM cells, however, information (charge) stored in a capacitor disappears with time. Therefore, to hold the recorded data, it is necessary to execute so-called refresh operation, in which the data is read and rewritten repeatedly, before the data disappears. This requirement that refresh operation must be executed constantly during the running of the device is a factor of impairing usability of DRAM devices.

The number of times of the refresh operation did not present a big problem because a sufficient amount of charge was stored in conventional capacitors. However, with the recent tendency of finer memory cells and use of MOS transistors as capacitors, it has become increasingly difficult to secure a sufficient capacitance value for capacitors. As a result, more frequent refresh operation is required, and this disadvantageously impairs the operation of the system.

SUMMARY OF THE INVENTION

An object of the present invention is eliminating the necessity of supplying a signal instructing refresh operation for DRAM cells from outside a DRAM circuit.

To attain the above object, according to the present invention, a DRAM cell includes a first transistor for external access to a charge storage capacitor and a second transistor for data refresh. Refresh operation for the DRAM cell is executed periodically with a periodic signal generated inside the DRAM circuit via the second transistor.

Specifically, the first semiconductor memory device of the present invention includes: a memory cell including a capacitor having a charge storage node, and a first MIS transistor and a second MIS transistor each having a first source/drain terminal connected to the charge storage node; a first word line and a first bit line respectively connected to a gate and a second source/drain terminal of the first MIS transistor; a second word line and a second bit line respectively connected to a gate and a second source/drain terminal of the second MIS transistor; and a timer circuit for generating a periodic signal having a predetermined period, wherein the first word line or the second word line is activated in response to the periodic signal.

In the first semiconductor memory device, the memory cell is subjected to refresh operation at the predetermined period with the periodic signal generated by the timer circuit provided internally. Accordingly, no supply of an external refresh signal is required, and thus the refresh operation (refresh signal) will no more adversely affect the operation of the memory device.

In the first semiconductor memory device of the present invention, the capacitor is preferably a MIS transistor kept in a conduction state at all times and is composed of a gate and a channel of the transistor. With this configuration, the memory cell is entirely composed of planer MIS transistors. This simplifies the manufacture and also enables high integration.

The second semiconductor memory device of the present invention includes: a plurality of memory cells each including a capacitor having a charge storage node, and a first MIS transistor and a second MIS transistor each having a first source/drain terminal connected to the charge storage node; a plurality of first word lines and a plurality of first bit lines respectively connected to gates and second source/drain terminals of the first MIS transistors; a plurality of second word lines and a plurality of second bit lines respectively connected to gates and second source/drain terminals of the second MIS transistors; a timer circuit for generating a periodic signal having a predetermined period, an access word line selection circuit for selectively activating the plurality of first word lines in response to an external access request; and a refresh word line selection circuit for selectively activating the plurality of second word lines at the predetermined period with the periodic signal.

In the second semiconductor memory device, the memory cells are subjected to refresh operation with the periodic signal from the timer circuit provided internally. Accordingly, no supply of a refresh signal from outside a memory block is required, and thus the refresh operation will no more adversely affect the operation of the memory device.

The second semiconductor device preferably further includes: a plurality of first sense amplifiers for data access connected to the respective first bit lines; and a plurality of second sense amplifiers for data refresh connected to the respective second bit lines, wherein the first sense amplifiers are activated in response to an external access request, and the second sense amplifiers are activated in response to the periodic signal.

In the second semiconductor memory device, preferably, the access word line selection circuit selectively activates the plurality of first word lines and the refresh word line selection circuit selectively activates the plurality of second word lines, both in synchronization with an external clock signal input externally.

In the case described above, an activation time period of the first word lines and an activation time period of the second word lines are preferably shifted in phase from each other. This ensures execution of the refresh operation without corrupting data held in the memory cell.

In particular, an activation time period of the first word lines and an activation time period of the second word lines are preferably set so as to be shifted in phase by a half period of a memory operation cycle.

The timer circuit is preferably a counter circuit for generating the periodic signal from the number of pulses of the external clock signal.

In the second semiconductor memory device, when an address value of a first word line selected from the plurality of first word lines is identical to an address value of a second word line selected from the plurality of second word lines at a same timing, the selected second word line is preferably disabled. This can prevent corruption of data held in the memory cell.

DESCRIPTION OF THE PREFERRED EMBODIMENTS

Hereinafter, preferred embodiments of the present invention will be described with reference to the accompanying drawings.

Embodiment 1

Figure 1:
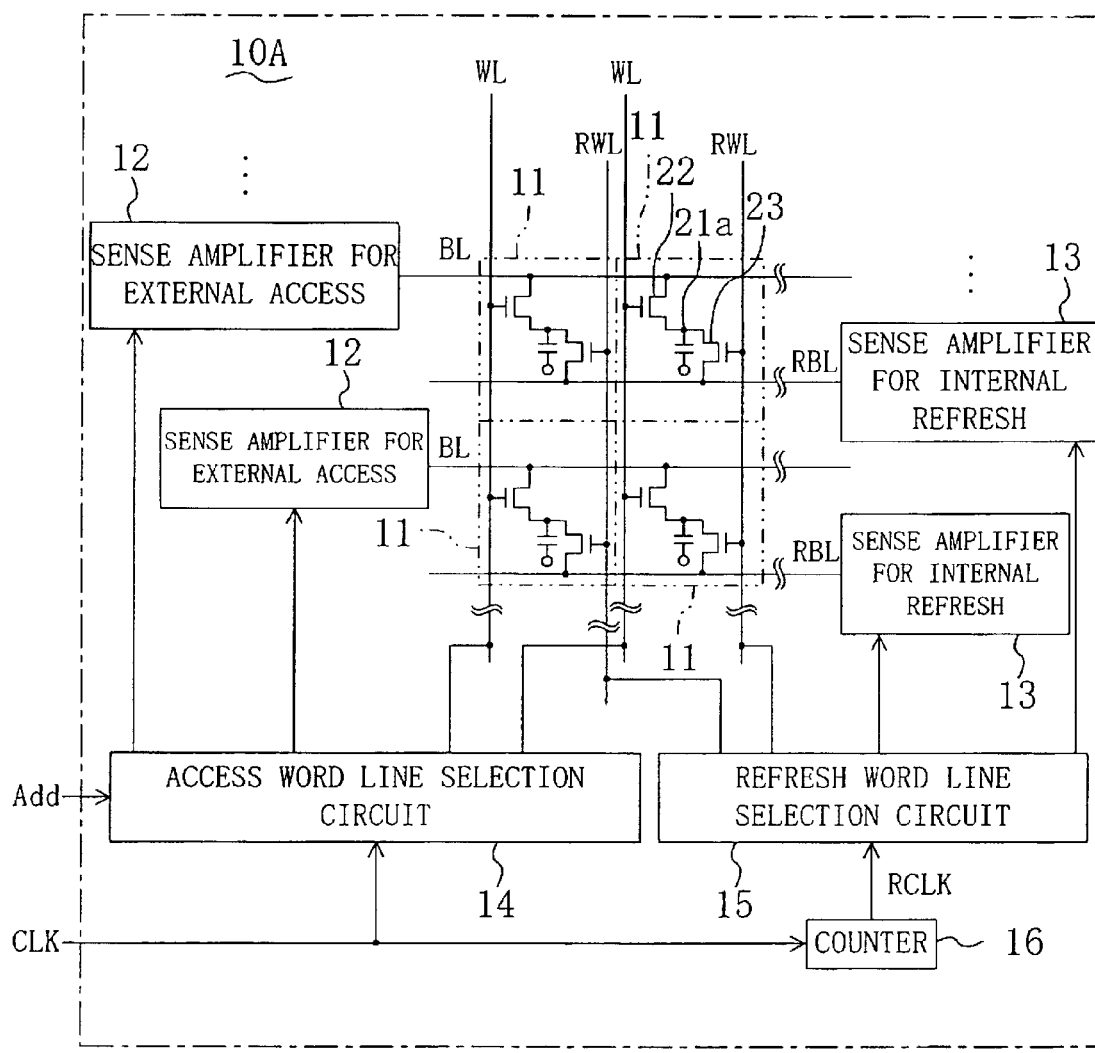
FIG. 1 is a block diagram of a semiconductor memory device of Embodiment 1 of the present invention.

FIG. 1 shows a circuit configuration of a semiconductor memory device 10A of Embodiment 1 of the present invention.

Referring to FIG. 1, the semiconductor memory device 10A includes a plurality of memory cells 11 arranged in a matrix. Each of the memory cells 11 includes a capacitor 21 having a charge storage node 21a, and first and second MOS transistors 22 and 23 having their sources connected to the charge storage node 21a.

The gate of the first MOS transistor 22 is connected to an access word line WL, and the drain thereof is connected to an access bit line BL. The gate of the second MOS transistor 23 is connected to a refresh word line RWL, and the drain thereof is connected to a refresh bit line RBL.

The access bit lines BL are electrically connected to sense amplifiers 12 for external access, and the refresh bit lines RBL are electrically connected to sense amplifiers 13 for internal refresh.

The access word lines WL are electrically connected to an access word line selection circuit 14, and the refresh word lines RWL are electrically connected to a refresh word line selection circuit 15.

The access word line selection circuit 14 selects an access word line WL designated by an address signal Add input externally among the plurality of access word lines WL in synchronization with an external clock signal CLK input externally.

The refresh word line selection circuit 15 is connected to a counter 16 as a timer circuit. The counter 16 generates a refresh clock signal RCLK in synchronization with the external clock signal CLK and outputs the generated signal. The refresh word line selection circuit 15 therefore autonomously selects the plurality of refresh word lines RWL in synchronization with the refresh clock signal RCLK received from the counter 16, to thereby activate the refresh word lines RWL periodically.

Figure 2:
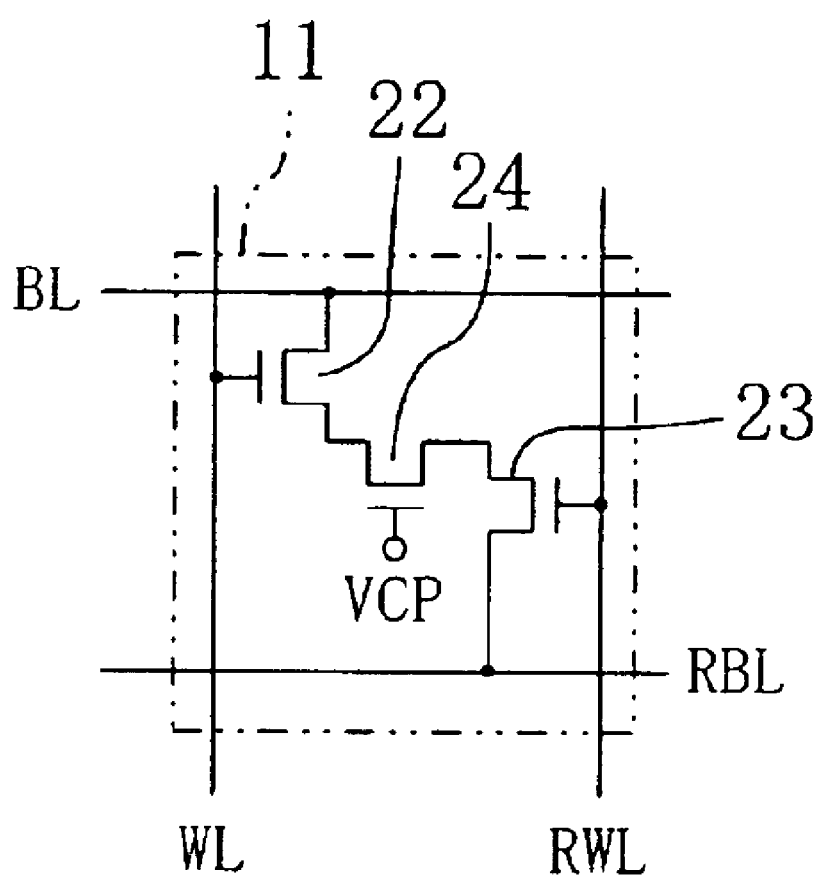
FIG. 2 is a circuit diagram of an alteration of a memory cell of the semiconductor memory device of Embodiment 1 of the present invention.

The capacitor 21 for data storage of each memory cell 11 may be replaced with a third MOS transistor 24 as shown in FIG. 2. The third MOS transistor 24 has its source and drain connected to the sources of the first and second MOS transistors 22 and 23, and is kept in the conduction state with its channel being formed at all times. In this case, the channel of the third MOS transistor 24 serves as the charge storage node.

The semiconductor memory device 10A of Embodiment 1 may be formed as one semiconductor chip, or may be embedded in a system LSI together with a microprocessor (MPU) and a logic circuit. In the case of a system LSI, the semiconductor memory device 10A serves as a memory circuit (memory block).

Hereinafter, the operation of the semiconductor memory device 10A having the configuration described above will be described with reference to the relevant drawings.

Figure 3:
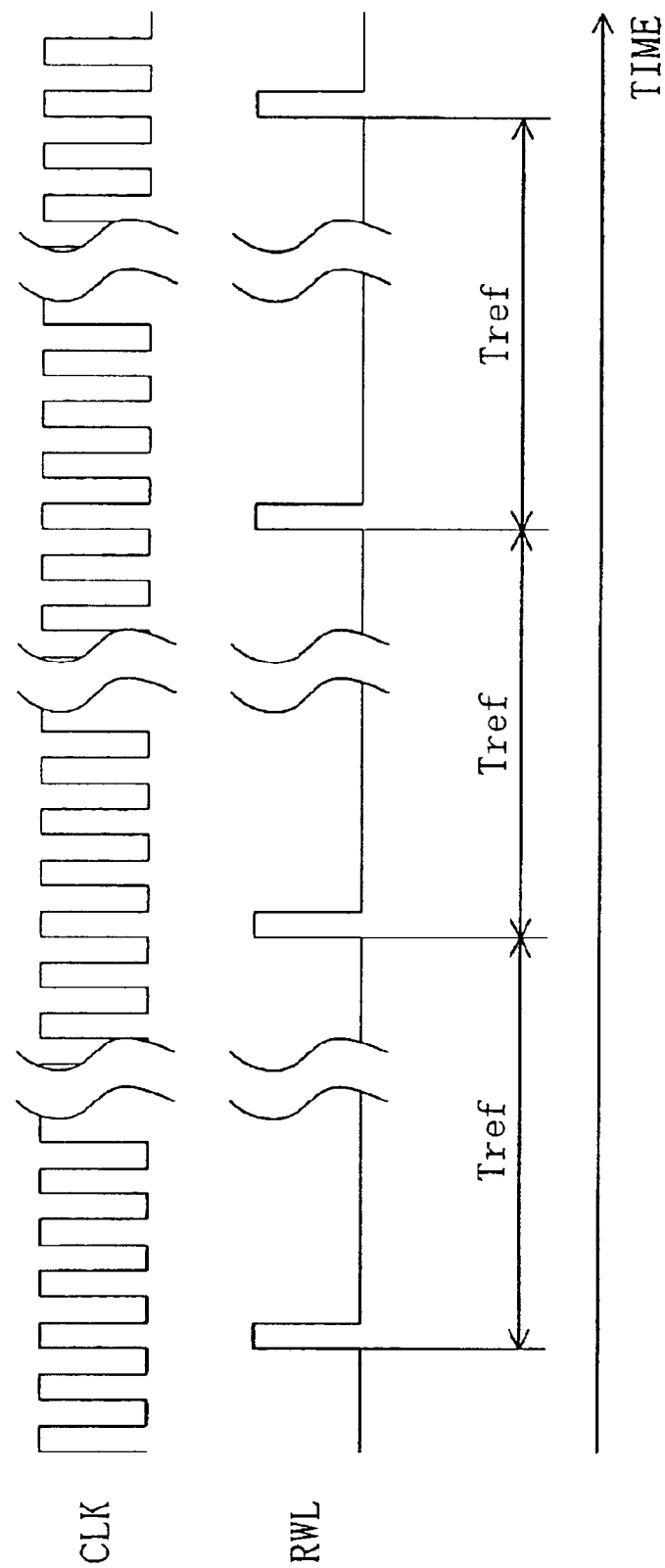
FIG. 3 is a timing chart of a refresh word line activation signal and an external clock signal in the semiconductor memory device of Embodiment 1 of the present invention.

FIG. 3 shows a timing chart of a refresh word line activating signal and an external clock signal in the semiconductor memory device of Embodiment 1.

Referring to FIG. 3, each refresh word line RWL connected to the gates of the second MOS transistors 23 of the memory cells 11 is activated at a refresh period Tref, a period according to the signal generated and output by the counter 16 that counts the number of clock cycles of the external clock signal CLK until a predetermined number is reached.

Figure 4:
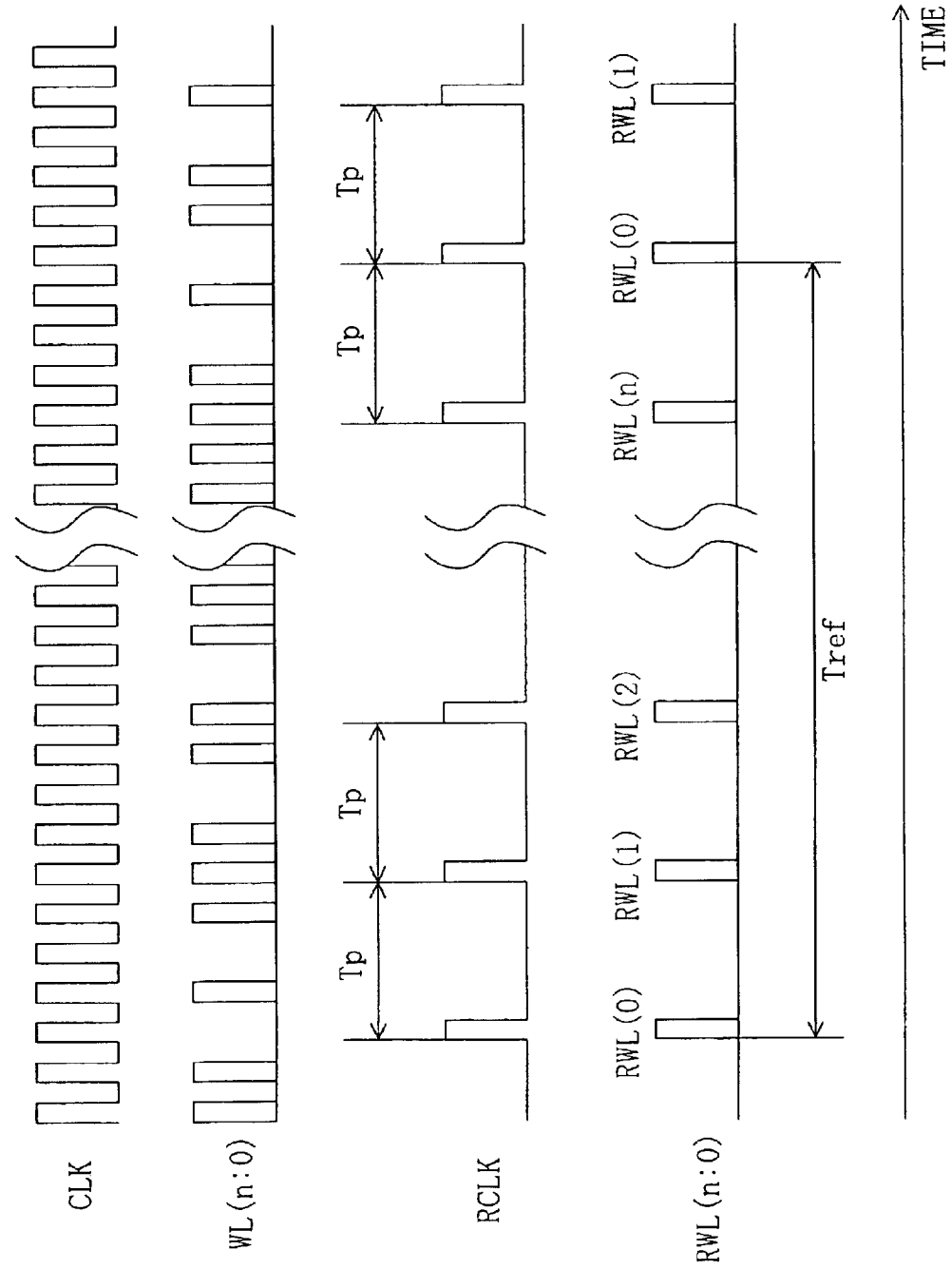
FIG. 4 is a timing chart of an access word line activation signal, a refresh word line activation signal, an external clock signal and a refresh clock signal in the semiconductor memory device of Embodiment 1 of the present invention.

FIG. 4 is a timing chart of an access word line activation signal, the refresh word line activation signal, the external clock signal and the refresh clock signal in the semiconductor memory device of Embodiment 1.

Referring FIG. 4, during external access requested aperiodically from outside, such as data read and data write, an access word line WL and a sense amplifier 12 for external access connected to an access bit line BL, selected by the access word line selection circuit 14 according to the address signal Add input in synchronization with the external clock signal CLK, are activated to thereby enable input/output of data from/to outside, as described earlier.

The internal refresh operation is executed with the refresh clock signal RCLK output from the counter 16 to the refresh word line selection circuit 15 at an inter-pulse period Tp that corresponds to four cycles of the external clock signal CLK. In other words, the refresh word lines RWL and the refresh bit lines RBL selected by the refresh word line selection circuit 15 in synchronization with the refresh clock signal RCLK are sequentially activated. Assuming that the total number of the refresh word lines RWL is (n+1) (n is a positive integer), when the refresh word lines RWL have been sequentially activated from the first RWL(0) through the final RWL(n), the refresh operation is repeated from the first refresh word line RWL(0). The period of repetition of this refresh operation is the refresh period Tref.

As described above, the refresh operation is executed reliably with the refresh clock signal RCLK, which is generated based on the external clock signal CLK by the counter 16 provided inside the semiconductor memory device 10A, before data held in each memory cell 11 disappears. In this way, disappearance of data in each memory cell 11 is prevented. Accordingly, an externally generated refresh signal, conventionally required, is no more necessary, and thus the operation of the semiconductor memory device 10A will not be impaired by supply of the external refresh signal. Moreover, since the number of external signal lines can be reduced, further high integration can be attained.

Although the inter-pulse period Tp of the refresh clock signal RCLK was set to correspond to four cycles of the external clock signal CLK in Embodiment 1, it is not limited to this value.

Figure 5A:
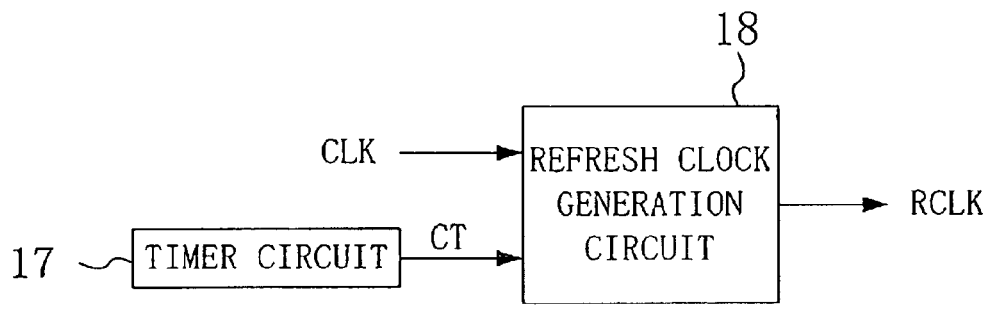
FIGS. 5A and 5B are a block diagram and a timing chart, respectively, for showing how to generate the refresh clock signal when a timer circuit is used in the semiconductor memory device of Embodiment 1 of the present invention.

As shown in FIG. 5A, the refresh clock signal RCLK may be generated using a timer circuit 17, which is a RC delay circuit composed of a resistance element and a capacitance element, for example, in place of the counter 16 counting the number of clock cycles. More precisely, as shown in FIG. 5A, the timer circuit 17 and a refresh clock generation circuit 18 may be used in place of the counter 16. The refresh clock generation circuit 18 receives a timer signal CT generated and output by the timer circuit 17 and the external clock signal CLK, and generates the refresh clock signal RCLK based on these signals.

Figure 5B:
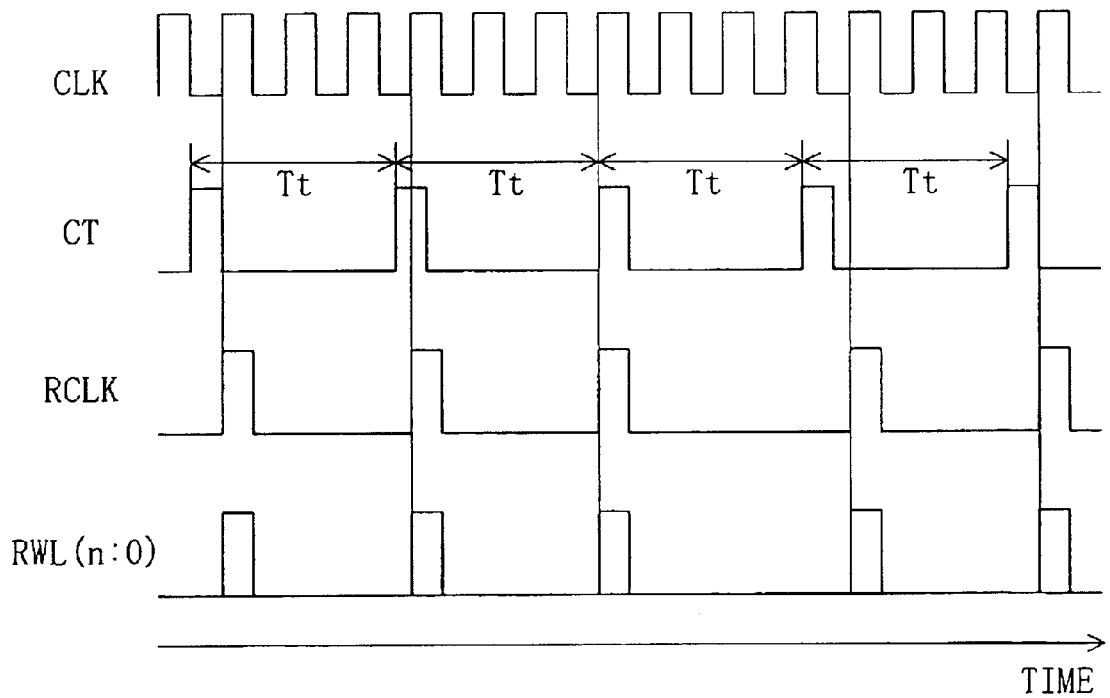

FIG. 5B shows a timing chart of the timer signal CT, the external clock signal CLK and the refresh clock signal RCLK. Referring to FIG. 5B, the refresh clock signal RCLK is activated in synchronization with every first pulse of the external clock signal CLK after every rising of the timer signal CT. The refresh word lines RWL are sequentially activated with the activation of the refresh clock signal RCLK.

(Alteration of Embodiment 1)

Figure 6:
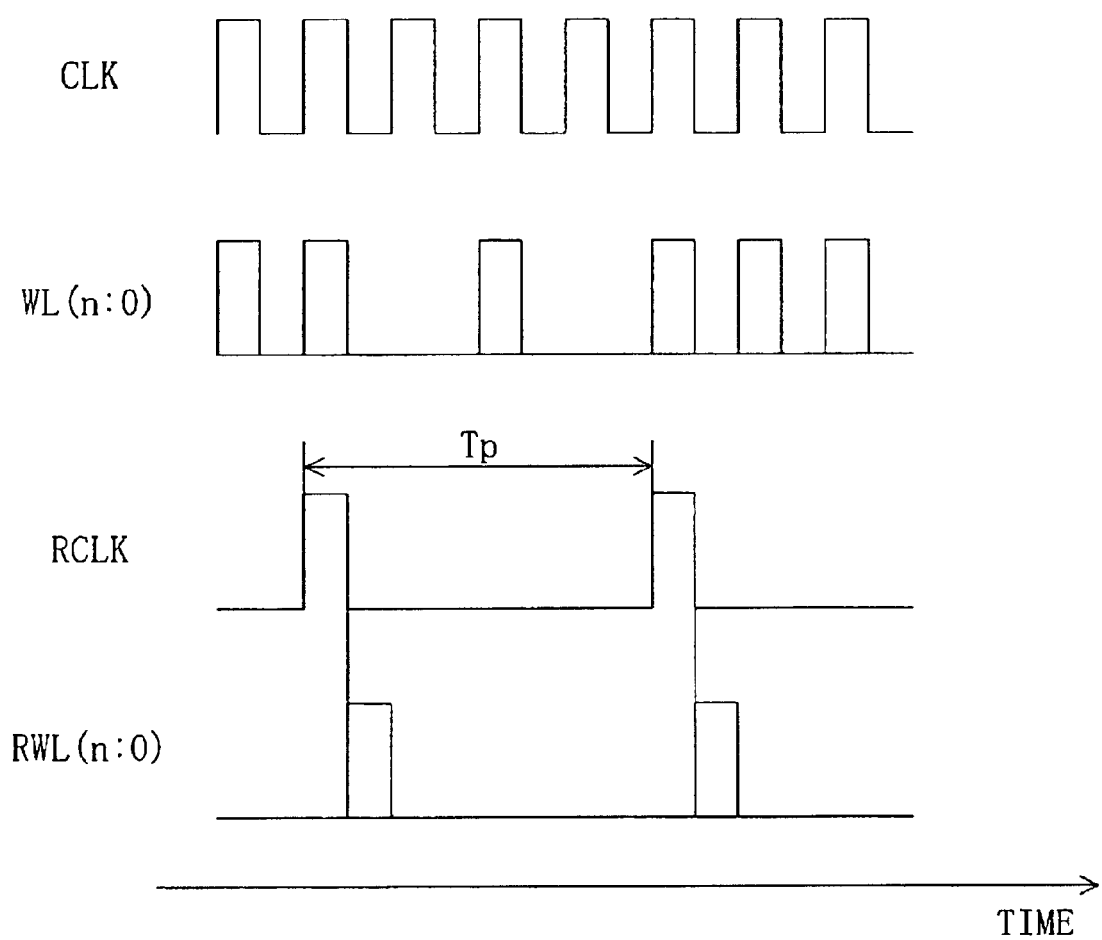
FIG. 6 is a timing chart of an access word line activation signal, a refresh word line activation signal, an external clock signal and a refresh clock signal in an alteration of the semiconductor memory device of Embodiment 1 of the present invention.

FIG. 6 shows a timing chart of an access word line activation signal, a refresh word line activation signal, an external clock signal and a refresh clock signal in a semiconductor memory device of an alteration of Embodiment 1 of the present invention.

As shown in FIG. 6, in this alteration, also, the refresh clock signal RCLK is activated at the inter-pulse period Tp corresponding to four cycles of the external clock signal CLK. The difference of this alteration from Embodiment 1 is that the activation of the refresh word lines RWL is performed during non-activation of the access word lines WL. More specifically, the refresh word lines RWL are activated for time periods respectively shifted from the activation time periods of the access word lines WL by a half period of the memory operation cycle, that is, in the illustrated example, by a half of the period of the external clock signal CLK.

The access word lines WL are selected and activated according to the address signal Add received aperiodically from outside, and the refresh word lines RWL are activated at a period (inter-pulse period Tp) determined by the counter 16 provided internally, as described earlier. Therefore, there possibly occurs an event that an access word line WL and a refresh word line RWL happen to access a same memory cell 11. In such an event, charge stored in the memory cell 11 is distributed both to the access bit line BL and the refresh bit line RBL. This reduces the voltage during initial read in both the sense amplifier 12 for external access and the sense amplifier 13 for internal refresh, and thus causes malfunction of the sense amplifiers 12 and 13.

If the access to the access bit line BL is for write operation, the write operation of the access bit line BL will collide with the read amplifying operation of the refresh bit line RBL, causing malfunction.

The malfunction described above can be prevented reliably in the alteration of Embodiment 1 in which the activation time periods of the refresh word lines RWL and the refresh bit lines RBL are set to fall within the non-activation time period during which the access word lines WL are not activated.

To implement the operation of this alteration, the refresh word line selection circuit 15 may be configured to activate the refresh word lines RWL at the timing of falling of the received refresh clock signal RCLK, for example.

Embodiment 2

Figure 7:
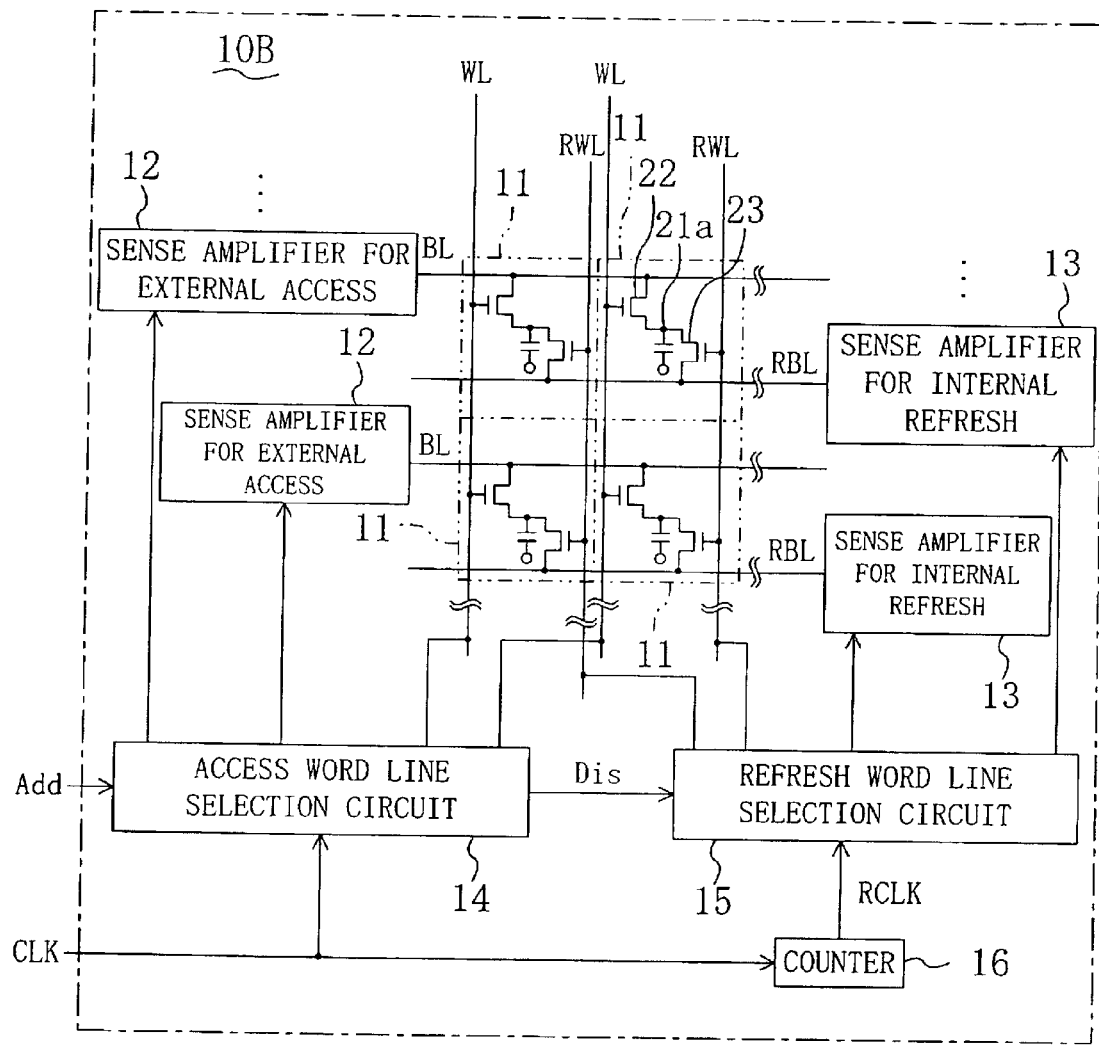
FIG. 7 is a block diagram of a semiconductor memory device of Embodiment 2 of the present invention.

FIG. 7 shows a circuit configuration of a semiconductor memory device 10B of Embodiment 2 of the present invention. In FIG. 7, the same components as those in FIG. 1 are denoted by the same reference numerals, and the description thereof is omitted here.

Figure 8A:
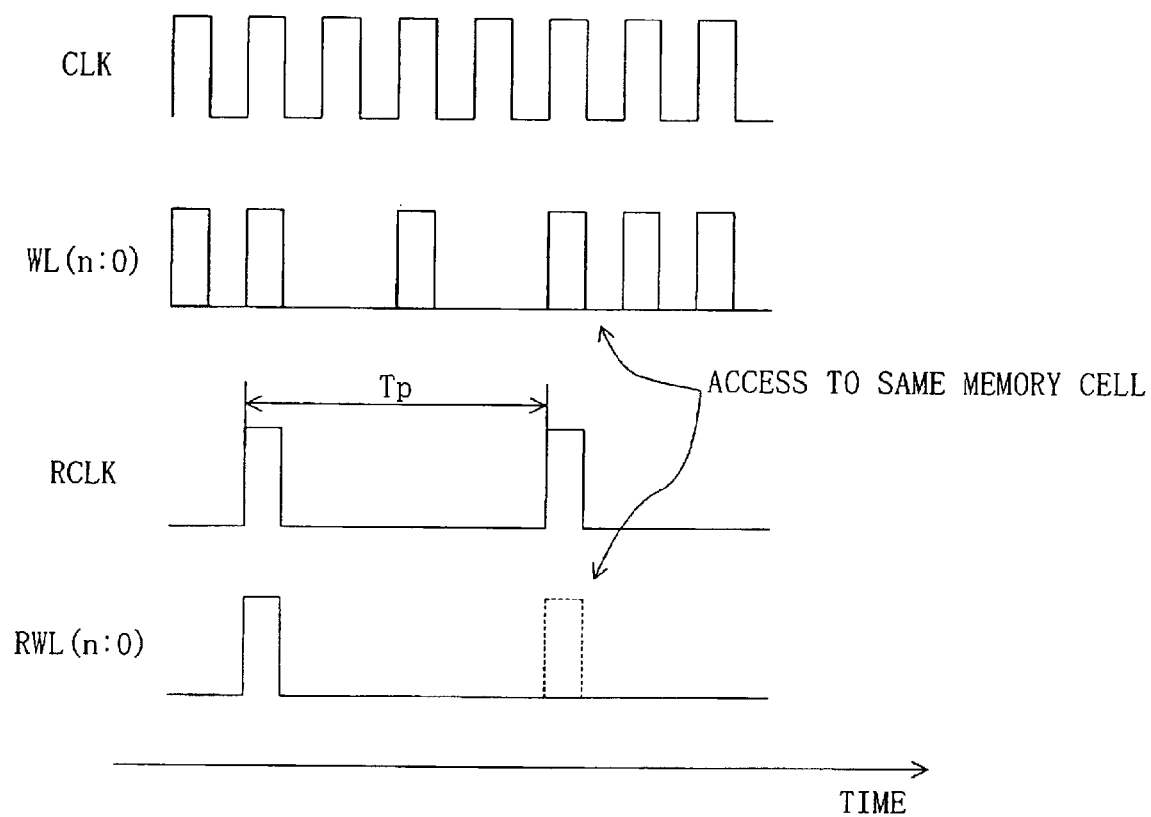
FIG. 8A is a timing chart of an access word line activation signal, a refresh word line activation signal, an external clock signal and a refresh clock signal in the semiconductor memory device of Embodiment 2 of the present invention.

As shown in FIG. 7, the semiconductor memory device 10B of Embodiment 2 has a feature that an activation disable signal Dis disabling activation of the refresh word lines RWL is output from the access word line selection circuit 14 to the refresh word line selection circuit 15. More specifically, as shown in the timing chart in FIG. 8A, the timings of activation of the access word lines WL and the refresh word lines RWL are the same, and in an event that an access word line WL and a refresh word line RWL access a same memory cell, the activation of the refresh word line RWL is disabled or masked.

Figure 8B:
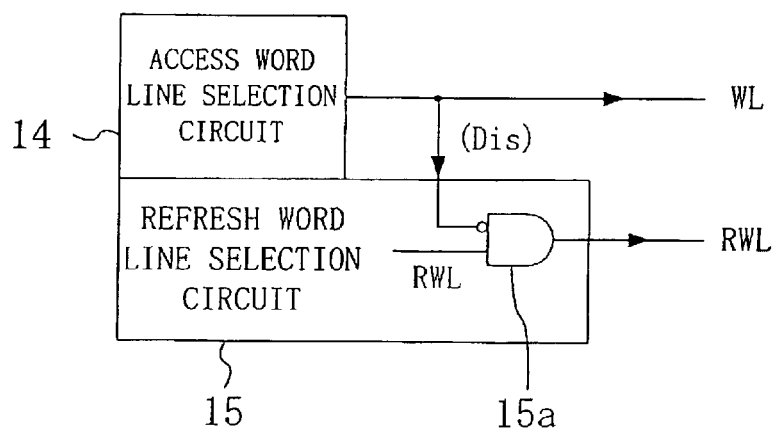
FIG. 8B is a block diagram of an access word line selection circuit and a refresh work line selection circuit of the semiconductor memory device of Embodiment 2 of the present invention.
Figure 9:
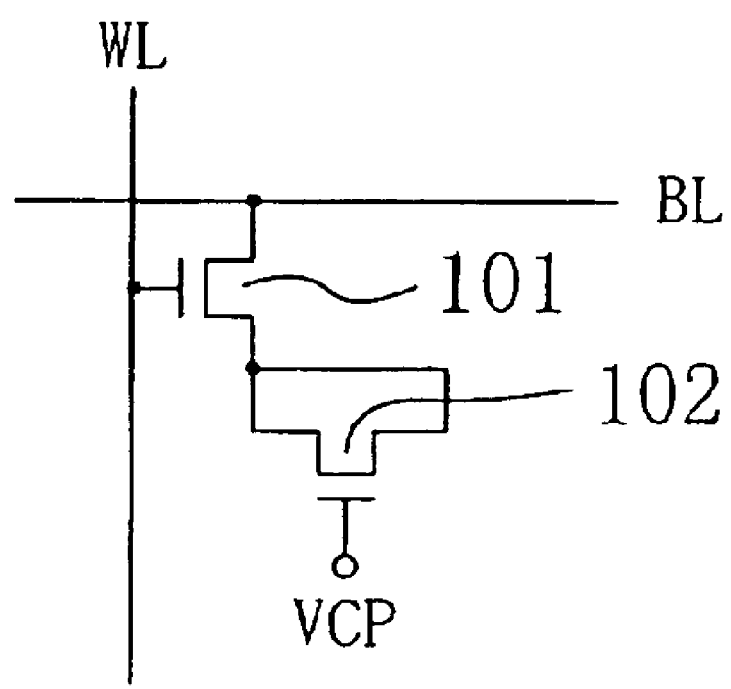
FIG. 9 is a circuit diagram of a conventional DRAM cell composed of only MOS transistors.

FIG. 8B shows an exemplary circuit configuration for implementing the activation disable signal Dis and the masking of the refresh word line RWL with the activation disable signal Dis.

Referring to FIG. 8B, the refresh word line selection circuit 15 includes a mask circuit 15a composed of an AND gate receiving the access word line activation signal (=activation disable signal Dis) in the inverted form. With this configuration, if the refresh word line selection circuit 15 selects a refresh word line RWL having an identical address value as an access word line WL currently selected and receiving a high-level activation signal, the selected refresh word line RWL is masked with the activation disable signal Dis and changed to a low-level non-activation signal.

As described above, in Embodiment 2, substantially the same effect as that obtained by the semiconductor memory device of Embodiment 1 is obtained. In addition, it is possible to avoid the occurrence that an access word line WL selected according to the address signal Add input externally and a refresh word line RWL selected autonomously by the refresh word line selection circuit 15 access a same memory cell at a same timing. Accordingly, malfunction in the memory cell 11 can be reliably prevented.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor memory device comprising:
   a plurality of memory cells each including a capacitor having a charge storage node, and a first MIS transistor and a second MIS transistor each having a first source/drain terminal connected to the charge storage node;
   a plurality of first word lines and a plurality of first bit lines respectively connected to gates and second source/drain terminals of the first MIS transistors;
   a plurality of second word lines and a plurality of second bit lines respectively connected to gates and second source/drain terminals of the second MIS transistors;
   a timer circuit for generating a periodic signal having a predetermined period;
   an access word line selection circuit for selectively activating the plurality of first word lines in response to an external access request;
   a refresh word line selection circuit for selectively activating the plurality of second word lines at the predetermined period with the periodic signal;
   a plurality of first sense amplifiers for data access connected to the respective first bit lines; and
   a plurality of second sense amplifiers for data refresh connected to the respective second bit lines,
   wherein the first sense amplifiers are activated in response to an external access request, and the second sense amplifiers are activated in response to the periodic signal, and
   wherein an activation time period of the first word lines and an activation time period of the second word lines are shifted in phase from each other.

2. The device of claim 1, wherein the access word line selection circuit selectively activates the plurality of first word lines and the refresh word line selection circuit selectively activates the plurality of second word lines, both in synchronization with a clock signal.

3. The device of claim 2, wherein the timer circuit is a counter circuit for generating the periodic signal from the number of pulses of the clock signal.

4. The device of claim 1, wherein when an address value of a first word line selected from the plurality of first word lines is identical to an address value of a second word line selected from the plurality of second word lines at a same timing, the selected second word line is disabled.

5. The device of claim 2, wherein the clock signal is an external clock signal which is input externally.

6. A semiconductor memory device comprising:
   a plurality of memory cells each including a capacitor having a charge storage node, and a first MIS transistor and a second MIS transistor each having a first source/drain terminal connected to the charge storage node;
   a plurality of first word lines and a plurality of first bit lines respectively connected to gates and second source/drain terminals of the first MIS transistors;
   a plurality of second word lines and a plurality of second bit lines respectively connected to gates and second source/drain terminals of the second MIS transistors;
   a timer circuit for generating a periodic signal having a predetermined period;
   an access word line selection circuit for selectively activating the plurality of first word lines in response to an external access request; and
   a refresh word line selection circuit for selectively activating the plurality of second word lines at the predetermined period with the periodic signal,
   wherein the access word line selection circuit selectively activates the plurality of first word lines and the refresh word line selection circuit selectively activates the plurality of second word lines, both in synchronization with a clock signal, and
   wherein an activation time period of the first word lines and an activation time period of the second word lines are shifted in phase from each other.

7. The device of claim 6, wherein when an address value of a first word line selected from the plurality of first word lines is identical to an address value of a second word line selected from the plurality of second word lines at a same timing, the selected second word line is disabled.

8. The device of claim 6, wherein the timer circuit is a counter circuit for generating the periodic signal from the number of pulses of the clock signal.

9. The device of claim 6, further comprising:
   a plurality of first sense amplifiers for data access connected to the respective first bit lines; and
   a plurality of second sense amplifiers for data refresh connected to the respective second bit lines,
   wherein the first sense amplifiers are activated in response to an external access request, and the second sense amplifiers are activated in response to the periodic signal.

10. The device of claim 6, wherein the clock signal is an external clock signal which is input externally.

11. A semiconductor memory device comprising:
    a plurality of memory cells each including a capacitor having a charge storage node, and a first MIS transistor and a second MIS transistor each having a first source/drain terminal connected to the charge storage node;
    a plurality of first word lines and a plurality of first bit lines respectively connected to gates and second source/drain terminals of the first MIS transistors;
    a plurality of second word lines and a plurality of second bit lines respectively connected to gates and second source/drain terminals of the second MIS transistors;
    a timer circuit for generating a periodic signal having a predetermined period;

an access word line selection circuit for selectively activating the plurality of first word lines in response to an external access request; and a refresh word line selection circuit for selectively activating the plurality of second word lines at the predetermined period with the periodic signal, wherein the access word line selection circuit selectively activates the plurality of first word lines and the refresh word line selection circuit selectively activates the plurality of second word lines, both in synchronization with a clock signal, and wherein an activation time period of the first word lines and an activation time period of the second word lines are set as to be shifted in phase by a half period of a memory operation cycle.

12. The device of claim 11, wherein when an address value of a first word line selected from the plurality of first word lines is identical to an address value of a second word line selected from the plurality of second word lines at a same timing, the selected second word line is disabled.

13. The device of claim 11, wherein the timer circuit is a counter circuit for generating the periodic signal from the number of pulses of the clock signal.

14. The device of claim 11, further comprising:

a plurality of first sense amplifiers for data access connected to the respective first bit lines; and a plurality of second sense amplifiers for data refresh connected to the respective second bit lines, wherein the first sense amplifiers are activated in response to an external access request, and the second sense amplifiers are activated in response to the periodic signal.

15. The device of claim 11, wherein the clock signal is an external clock signal which is input externally.

* * * * *